(12) United States Patent
Kim et al.

(10) Patent No.: US 12,279,475 B2
(45) Date of Patent: *Apr. 15, 2025

(54) ORGANIC LIGHT-EMITTING DIODE HAVING COLOR DISTANCES BETWEEN PIXEL ELECTRODES AND ORGANIC EMISSION LAYERS AND LIGHT-EMITTING DISPLAY APPARATUS COMPRISING THE SAME

(71) Applicant: Samsung Display Co., Ltd., Yongin-Si (KR)

(72) Inventors: Sungwook Kim, Yongin-si (KR); Kyungsik Kim, Yongin-si (KR); Seulong Kim, Yongin-si (KR); Tsuyoshi Naijo, Yongin-si (KR); Sungsoo Bae, Yongin-si (KR); Dongchan Lee, Yongin-si (KR); Hyein Jeong, Yongin-si (KR); Hyewon Choi, Yongin-si (KR); Seungjin Chu, Yongin-si (KR); Jaeweon Hur, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,463

(22) Filed: Jul. 24, 2023

(65) Prior Publication Data

US 2024/0023367 A1 Jan. 18, 2024

Related U.S. Application Data

(63) Continuation of application No. 17/900,007, filed on Aug. 31, 2022, now Pat. No. 11,758,760, which is a
(Continued)

(30) Foreign Application Priority Data

Jul. 3, 2019 (KR) .................. 10-2019-0080317

(51) Int. Cl.
| | | |
|---|---|---|
| H10K 50/852 | (2023.01) | |
| H10K 59/12 | (2023.01) | |
| H10K 102/00 | (2023.01) | |

(52) U.S. Cl.
CPC .......... H10K 50/852 (2023.02); H10K 59/12 (2023.02); H10K 2102/351 (2023.02)

(58) Field of Classification Search
CPC .............................. H10K 50/852; H10K 59/12
See application file for complete search history.

(56) References Cited

U.S. PATENT DOCUMENTS

| | | |
|---|---|---|
| 6,861,800 B2 | 3/2005 | Tyan et al. |
| 8,188,315 B2 | 5/2012 | Hwang et al. |
| (Continued) | | |

FOREIGN PATENT DOCUMENTS

| | | |
|---|---|---|
| CN | 105023937 | 11/2015 |
| CN | 109390375 | 2/2019 |
| (Continued) | | |

OTHER PUBLICATIONS

Chen, Yi-Jiun, et al. "A vision toward ultimate optical out-coupling for organic light-emitting diode displays: 3D pixel configuration." Advanced Science 5.10 (2018): 1800467. (Year: 2018).

*Primary Examiner* — Michael Jung
(74) *Attorney, Agent, or Firm* — KILE PARK REED & HOUTTEMAN PLLC (57) ABSTRACT

An organic light-emitting display apparatus including; a first pixel electrode, a second pixel electrode, a third pixel electrode; a first lower functional layer, a second lower functional layer, and a third lower functional layer; a first organic emission layer for emitting a first color, a second organic emission layer for emitting a second color, and a third organic emission layer for emitting a third color; an opposite electrode; and a first upper functional layer, a second upper functional layer, and a third upper functional
(Continued)

layer respectively disposed between the opposite electrode and the first organic emission layer, the second organic emission layer, and the third organic emission layer and each having a thickness that is equal to or greater than about 1300 Å and less than or equal to about 1800 Å.

16 Claims, 7 Drawing Sheets

Related U.S. Application Data continuation of application No. 16/851,174, filed on Apr. 17, 2020, now Pat. No. 11,437,604.

(56) References Cited

U.S. PATENT DOCUMENTS

| | | | |
|---|---|---|---|
| 8,546,816 | B2 | 10/2013 | Reineke et al. |
| 9,105,860 | B2 | 8/2015 | Hwang et al. |
| 9,570,710 | B2 | 2/2017 | Oh et al. |
| 9,620,743 | B2 | 4/2017 | Han et al. |
| 10,249,848 | B2 | 4/2019 | Yoneda et al. |
| 10,283,727 | B2 | 5/2019 | Mishima |
| 10,347,697 | B2 | 7/2019 | Kashiwabara et al. |
| 10,553,651 | B2 | 2/2020 | Yim et al. |
| 10,854,680 | B2 | 12/2020 | Yokota |
| 11,398,614 | B2 | 7/2022 | Koch et al. |
| 2009/0051275 | A1* | 2/2009 | Kobayashi ........... H10K 50/125 257/E21.007 |
| 2009/0121239 | A1 | 5/2009 | Asaki et al. |
| 2010/0320481 | A1 | 12/2010 | Kashiwabara |
| 2012/0319115 | A1 | 12/2012 | Lee et al. |
| 2013/0001532 | A1 | 1/2013 | Hwang et al. |
| 2015/0137082 | A1 | 5/2015 | Kim et al. |
| 2015/0318515 | A1 | 11/2015 | Han et al. |
| 2016/0025302 | A1* | 1/2016 | Shiratori ................ H10K 59/38 362/231 |
| 2016/0056214 | A1 | 2/2016 | Pyo et al. |
| 2016/0329383 | A1 | 11/2016 | Li et al. |
| 2017/0033306 | A1 | 2/2017 | Song et al. |
| 2019/0043931 | A1 | 2/2019 | Yim et al. |
| 2019/0123303 | A1* | 4/2019 | Yasukawa ........... H10K 59/873 |

FOREIGN PATENT DOCUMENTS

| | | |
|---|---|---|
| DE | 10 2007 020 644 | 11/2008 |
| JP | 2017-501585 | 1/2017 |
| JP | 2018-61014 | 4/2018 |
| JP | 2019-16550 | 1/2019 |
| KR | 10-0846608 | 7/2008 |
| KR | 10-2011-0067139 | 6/2011 |
| KR | 10-2012-0139386 | 12/2012 |
| KR | 10-2016-0032338 | 3/2016 |
| KR | 10-2019-0022958 | 3/2019 |
| WO | 2013/065213 | 5/2013 |

* cited by examiner

| EMBODIMENT | color | EFFICIENCY (%) | LIFETIME (%) |
|---|---|---|---|
| EMBODIMENT 1 | Blue | 100 | 200 |
| COMPARATIVE EXAMPLE 1-1 (SECOND RESONANCE) | | 100 | 100 |
| COMPARATIVE EXAMPLE 1-2 (THIRD RESONANCE) | | 80 | 90 |
| EMBODIMENT 2 | Green | 100 | 150 |
| COMPARATIVE EXAMPLE 2-1 (SECOND RESONANCE) | | 100 | 100 |
| COMPARATIVE EXAMPLE 2-2 (THIRD RESONANCE) | | 80 | 100 |
| EMBODIMENT 3 | Red | 100 | 150 |
| COMPARATIVE EXAMPLE 3-1 (SECOND RESONANCE) | | 100 | 100 |
| COMPARATIVE EXAMPLE 3-2 (THIRD RESONANCE) | | 70 | 80 |

ORGANIC LIGHT-EMITTING DIODE HAVING COLOR DISTANCES BETWEEN PIXEL ELECTRODES AND ORGANIC EMISSION LAYERS AND LIGHT-EMITTING DISPLAY APPARATUS COMPRISING THE SAME

CROSS-REFERENCE TO RELATED APPLICATION

This is a continuation application of U.S. patent application Ser. No. 17/900,007 filed Aug. 31, 2022, now U.S. Pat. No. 11,758,760, issued Sep. 12, 2023, the disclosure of which is incorporated herein by reference in its entirety. U.S. patent application Ser. No. 17/900,007 is a continuation application of U.S. patent application Ser. No. 16/851,174 filed Apr. 17, 2020, now U.S. Pat. No. 11,437,604 issued Sep. 6, 2022, the disclosure of which is incorporated herein by reference in its entirety. U.S. patent application Ser. No. 16/851,174 claims the benefit of Korean Patent Application No. 10-2019-0080317 filed on Jul. 3, 2019, in the Korean Intellectual Property Office, the disclosure of which is incorporated herein in its entirety by reference in its entirety for all purposes.

BACKGROUND

1. Field

One or more embodiments relate to an organic light-emitting diode and an organic light-emitting display apparatus including the same, and more particularly, to an organic light-emitting diode of which a lifetime effectively expands at room temperature and a high temperature, and an organic light-emitting display apparatus including the same.

2. Description of Related Art

Among display apparatuses, an organic light-emitting display apparatus has wide viewing angles, good contrast, and a fast response speed and thus has drawn the attention as a next-generation display apparatus.

As a display apparatus, the organic light-emitting display apparatus includes a hole injection electrode, an electron injection electrode, and an organic emission layer disposed between the hole injection electrode and the electron injection electrode. The organic light-emitting display apparatus is a self-emissive display apparatus that emits visible light when holes injected from the hole injection electrode are recombined with electrons injected from the electron injection electrode in the organic emission layer to form an exciton. The decay of excited state results in a relaxation of the energy levels of the electron, thereby accompanied by emission of radiation whose frequency is in the visible region.

Because the organic light-emitting display apparatus is self-emissive and does not require a separate light source, the organic light-emitting display apparatus is operable using a low voltage, thin and light, has good characteristics such as viewing angles, contrast ratios, and response rates, and thus is used in various fields from personal portable devices such as an MP3 player or a mobile phone to TVs.

SUMMARY

Such an organic light-emitting display apparatus has a wide emission wavelength, and thus the emission efficiency and color purity thereof degrade. Also, because light emitted from the organic emission layer has no specific orientation, most photons emitted in an arbitrary direction cannot reach an actual observer due to total internal reflection of an organic light-emitting diode, and thus the light extraction efficiency of the organic light-emitting diode degrades.

Accordingly, a structure of an organic light-emitting display apparatus is suggested that includes a microcavity to improve light efficiency. However, when a microcavity structure is applied to an organic light-emitting display apparatus, movement distances of electrons and holes are different due to a thickness difference between functional layers disposed over and below an organic emission layer. The thickness difference causes a charge imbalance in the organic emission layer, thus degrades the lifetime of the organic light-emitting display apparatus.

One or more embodiments include an organic light-emitting diode of which a lifetime effectively expands and an organic light-emitting display apparatus including the organic light-emitting diode. However, this is merely an example, and the scope of the disclosure is not limited thereto.

Additional aspects will be set forth in part in the description which follows and, in part, will be apparent from the description, or may be learned by practice of the presented embodiments of the disclosure According to one or more embodiments, a display apparatus includes a first pixel electrode, a second pixel electrode, and a third pixel electrode which are disposed on a substrate, a lower functional layer, the lower functional layer including a first lower functional layer, a second lower functional layer, and a third lower functional layer, which are disposed on the first pixel electrode, the second pixel electrode, and the third pixel electrode, respectively, a first organic emission layer for emitting a first color, a second organic emission layer for emitting a second color, and a third organic emission layer for emitting a third color, which are disposed on the first lower functional layer, the second lower functional layer, and the third lower functional layer, respectively, an opposite electrode disposed over the first organic emission layer, the second organic emission layer, and the third organic emission layer, and an upper functional layer, the upper functional layer including a first upper functional layer, a second upper functional layer, and a third upper functional layer respectively disposed between the opposite electrode and the first organic emission layer, the second organic emission layer, and the third organic emission layer and each having a thickness that is equal to or greater than about 1300 Å and less than or equal to about 1800 Å.

The first organic emission layer may emit red light, and a thickness of the first lower functional layer may be equal to or greater than about 1800 Å and less than or equal to about 2600 Å.

The second organic emission layer may emit green light, and a thickness of the second lower functional layer may be equal to or greater than about 1300 Å and less than or equal to about 1800 Å.

The third organic emission layer may emit blue light, and a thickness of the third lower functional layer may be equal to or greater than about 1000 Å and less than or equal to about 1600 Å.

In a first pixel, the first organic emission layer may emit light of a first wavelength, and a distance between an upper surface of the first pixel electrode and a lower surface of the opposite electrode may be substantially the same as a distance in which a third resonance of the light of the first wavelength is produced.

A distance between the upper surface of the first pixel electrode and a lower surface of the first organic emission layer may be substantially the same as a distance in which a second resonance of the light of the first wavelength is produced.

According to one or more embodiments, there is provided an organic light-emitting display apparatus including pixels including organic light-emitting diodes, the organic light-emitting diodes each including a pixel electrode; an opposite electrode disposed on the pixel electrode and facing the pixel electrode, an organic emission layer disposed between the pixel electrode and the opposite electrode and emitting light of a first wavelength, a lower functional layer disposed between the pixel electrode and the organic emission layer, and an upper functional layer disposed between the organic emission layer and the opposite electrode, wherein a distance between an upper surface of the pixel electrode and a lower surface of the opposite electrode, is a distance in which a third resonance of the light of the first wavelength is produced, and a distance between the upper surface of the pixel electrode and a lower surface of the organic emission layer, is a distance in which a second resonance of the light of the first wavelength is produced.

A thickness of the upper functional layer may be equal to or greater than about 1300 Å and less than or equal to about 1800 Å.

The organic emission layer may emit the red light, and a thickness of the lower functional layer may be equal to or greater than about 1800 Å and less than or equal to about 2600 Å.

The thickness of the upper functional layer to the thickness of the lower functional layer may have a ratio of 1:1.2 to 1:1.4.

The organic emission layer may emit the green light, and a thickness of the lower functional layer may be equal to or greater than about 1300 Å and less than or equal to about 1800 Å.

The thickness of the upper functional layer to the thickness of the lower functional layer may have a ratio of 1:1 to 1:1.02.

The organic emission layer may emit the blue light, and a thickness of the lower functional layer may be equal to or greater than about 1000 Å and less than or equal to about 1600 Å.

The thickness of the upper functional layer to the thickness of the lower functional layer may have a ratio of 1:0.7 to 1:0.9.

The pixel electrode may be a reflective electrode, and the opposite electrode may be a light-transmissive electrode.

The organic light-emitting display apparatus may further include a capping layer disposed on the pixel electrode.

According to one or more embodiments, an organic light-emitting diode includes a pixel electrode, an opposite electrode disposed on the pixel electrode and facing the pixel electrode, an organic emission layer disposed between the pixel electrode and the opposite electrode and emitting light of a first wavelength, a lower functional layer disposed between the pixel electrode and the organic emission layer, and an upper functional layer disposed between the organic emission layer and the opposite electrode, wherein a distance between an upper surface of the pixel electrode and a lower surface of the opposite electrode, is a distance in which a third resonance of the light of the first wavelength is produced, and a distance between the upper surface of the pixel electrode and a lower surface of the organic emission layer, is a distance in which a second resonance of the light of the first wavelength is produced.

When the organic emission layer emits the red light, a thickness of the upper functional layer may be equal to or greater than about 1300 Å and less than or equal to about 1800 Å, and a thickness of the lower functional layer may be equal to or greater than about 1800 Å and less than or equal to about 2600 Å.

When the organic emission layer emits the green light, a thickness of the upper functional layer may be equal to or greater than about 1300 Å and less than or equal to about 1800 Å, and a thickness of the lower functional layer may be equal to or greater than about 1300 Å and less than or equal to about 1800 Å.

When the organic emission layer emits the blue light, a thickness of the upper functional layer may be equal to or greater than about 1300 Å and less than or equal to about 1800 Å, and a thickness of the lower functional layer may be equal to or greater than about 1000 Å and less than or equal to about 1600 Å.

In addition to the aforesaid details, other aspects, features, and advantages will be clarified from the detailed description, claims, and drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the disclosure will be described in detail by explaining embodiments of the disclosure with reference to the attached drawings, like reference numerals in the drawings denote like elements, and thus their description will be omitted.

It will be understood that although the terms "first," "second," etc. may be used herein to describe various components, these components should not be limited by these terms and are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Throughout the disclosure, the expression "at least one of A and/or B" indicates only A, only B, or both A and B. In addition, the expression "at least one of A and B" indicates only A, only B, or both A and B.

It will be understood that when a layer, region, or component is referred to as being "connected to" another layer, region, or component, it can be directly connected to the other layer, region, or component, and/or indirectly connected thereto with intervening layers, regions, or components therebetween. For example, it will be understood that when a layer, region, or component is referred to as being "electrically connected to" another layer, region, or component, it can be directly electrically connected to the other layer, region, or component, and/or indirectly electrically connected thereto with intervening layers, regions, or components therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1:
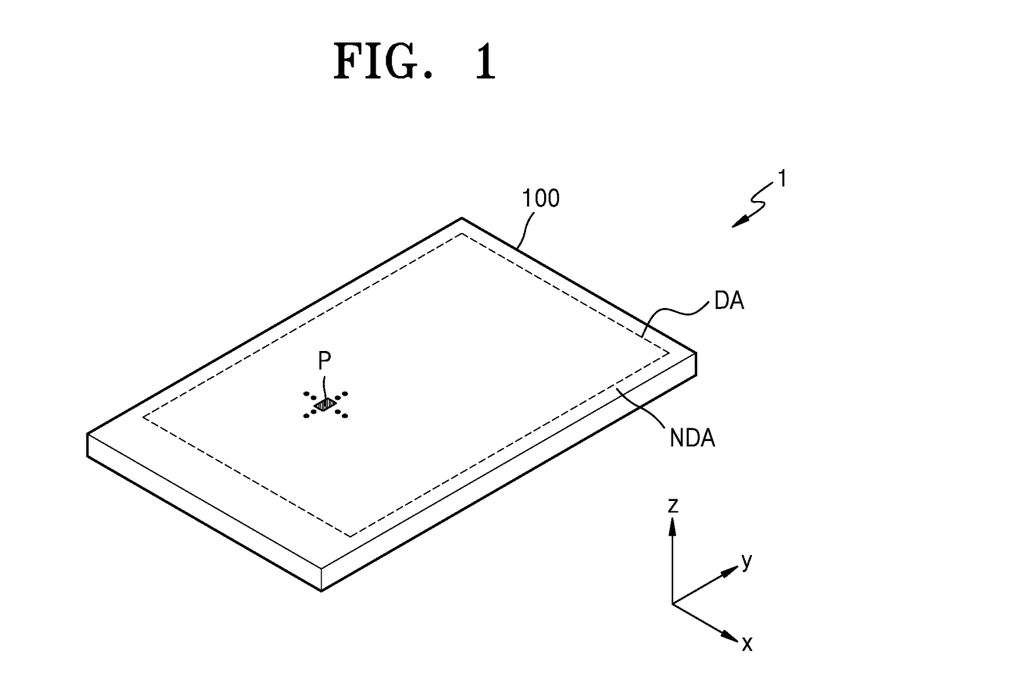
FIG. 1 is a schematic perspective view of an organic light-emitting display apparatus according to an embodiment.
Figure 2:
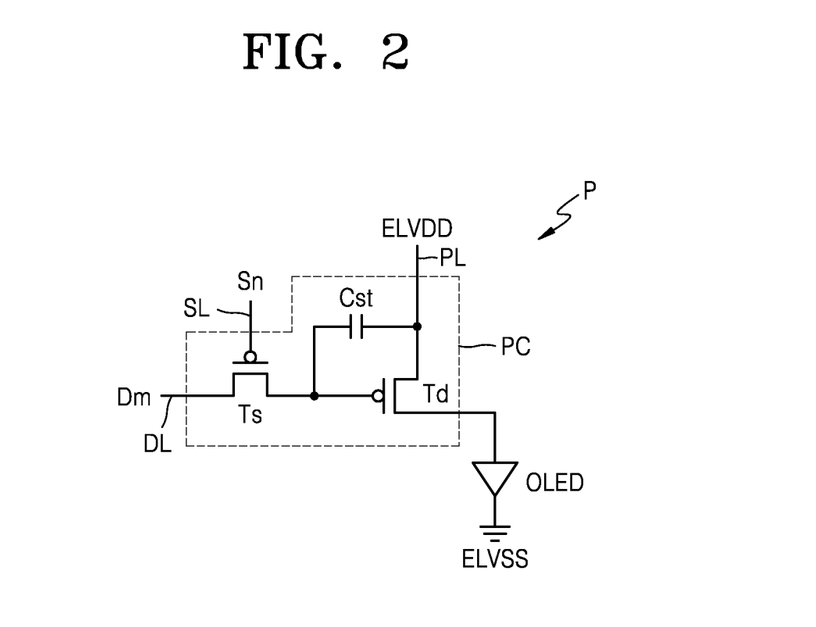
FIG. 2 is an equivalent circuit diagram of a pixel that may be included in an organic light-emitting display apparatus, according to an embodiment.

FIG. 1 is a schematic perspective view of an organic light-emitting display apparatus according to an embodiment, and FIG. 2 is an equivalent circuit diagram of a pixel that may be included in an organic light-emitting display apparatus, according to an embodiment.

Referring to FIG. 1, the organic light-emitting display apparatus 1 includes a display area DA displaying images and a non-display area NDA disposed to surround a peripheral area of the display area DA and not displaying images. The organic light-emitting display apparatus 1 may provide images to the outside by using light emitted from the display area DA. FIG. 1 illustrates that the display area DA of the organic light-emitting display apparatus 1 has a rectangular shape, but one or more embodiments are not limited thereto. A shape of the display area DA may be a circle, an oval, a triangle, or a polygon such as a pentagon.

A substrate 100 may include a glass material or polymer resin. The substrate 100 including polymer resin may be flexible. FIG. 1 illustrates that the organic light-emitting display apparatus 1 is a flat organic light-emitting display apparatus, but various modifications may be made thereto; for example, the organic light-emitting display apparatus 1 including the substrate 100 may have flexibility to be curved, bendable, rollable, or foldable.

The organic light-emitting display apparatus 1 includes pixels P arranged in the display area DA of the substrate 100. The pixels P may each include a display device such as an organic light-emitting diode OLED disclosed in FIG. 2. Each pixel P may emit light of a color such as red, green, blue, or white emitted from the organic light-emitting diode OLED.

Hereinafter, respective pixels P denote sub-pixels emitting different light colors, and each pixel P may be a sub-pixel emitting red (R), green (G), or blue (B) light.

Although not illustrated, the organic light-emitting display apparatus 1 may include components. Such components may be on a side of the substrate to correspond to the display area DA or the non-display area NDA.

The components may be electronic components using light or sound. For example, an electronic component may be a sensor, e.g., an infrared sensor, which receives and uses light, a camera capturing images by receiving light, a sensor measuring a distance or recognizing fingerprints, etc. by outputting and detecting light or sound, a small lamp emitting light, a speaker outputting sound, or the like.

Referring to FIG. 2, each pixel P includes a pixel circuit PC connected to a scan line SL and a data line DL and an organic light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL, and transmits data signals to a node disposed between the switching transistor Ts and the driving transistor TD in response to a scan signal Sn input through the scan line SL.

The storage capacitor Cst is connected to the switching thin film transistor Ts and a driving voltage line PL and stores a voltage corresponding to a difference between a data voltage received from the switching thin film transistor Ts and a first power voltage ELVDD (or a driving voltage) provided to the driving voltage line PL.

The driving thin film transistor Td may be connected to the driving voltage line PL and the storage capacitor Cst and may control a driving current flowing through the organic light-emitting diode OLED in accordance with a voltage value stored in the storage capacitor Cst. The organic light-emitting diode OLED may emit light having certain brightness according to the driving current.

FIG. 2 illustrates that the pixel circuit PC includes two thin film transistors and one storage capacitor, but one or more embodiments are not limited thereto. In another embodiment, the pixel circuit PC may include three thin film transistors and two storage capacitors. In another embodiment, the pixel circuit PC may include seven thin film transistors and one storage capacitor. In another embodiment, the pixel circuit PC may include seven thin film transistors and at least two storage capacitors.

Figure 3:
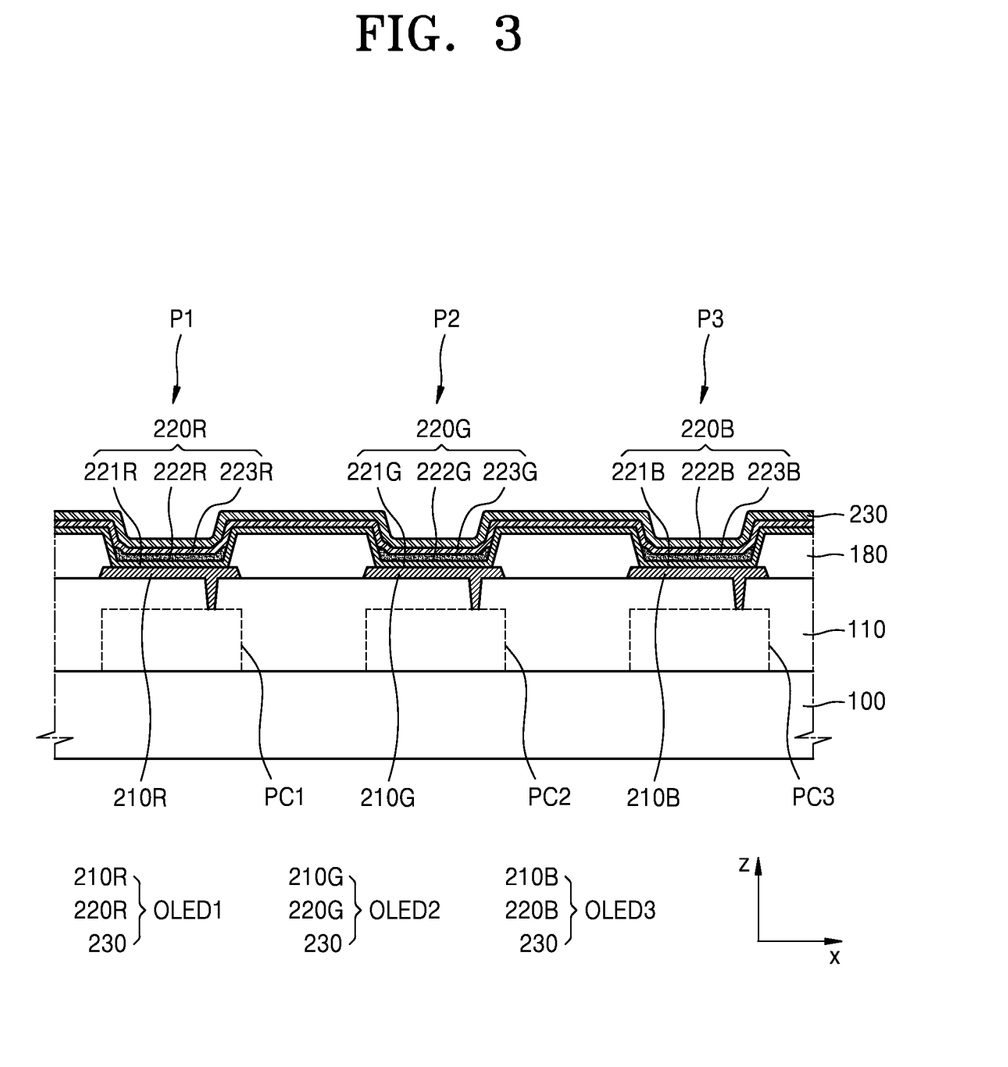
FIG. 3 is a schematic cross-sectional view of part of an organic light-emitting display apparatus, according to an embodiment.
Figure 4:
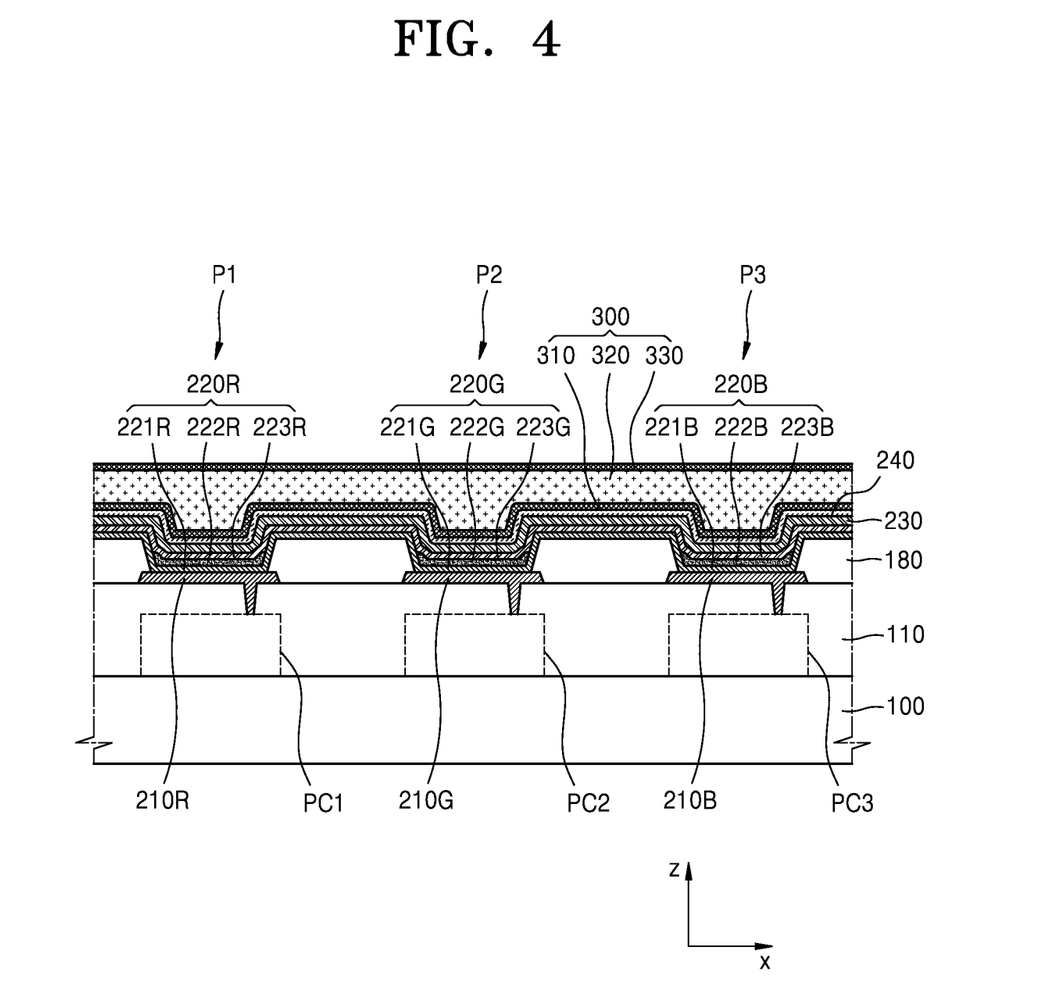
FIG. 4 is a schematic cross-sectional view of part of an organic light-emitting display apparatus, according to an embodiment.

FIGS. 3 and 4 are schematic cross-sectional views of part of an organic light-emitting display apparatus, according to an embodiment.

Referring to FIG. 3, the organic light-emitting display apparatus includes a first pixel P1, a second pixel P2, and a third pixel P3, which emit light of different wavelengths. The first pixel P1, the second pixel P2, and the third pixel P3 may respectively include a first organic light-emitting diode OLED1, a second organic light-emitting diode OLED2, and a third organic light-emitting diode OLED3. In an embodiment, the first organic light-emitting diode OLED1 may emit light of a red wavelength, the second organic light-emitting diode OLED2 may emit light of a green wavelength, and third organic light-emitting diode OLED3 may emit light of a blue wavelength.

The substrate 100 may include a glass or a polymer resin. When the substrate 100 includes the polymer resin, the organic light-emitting display apparatus may be curved, bendable, rollable, or foldable. The polymer resin may include, for example, polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like. In an embodiment, the substrate 100 may include at least two organic layers including PI and may have a multilayer structure in which the at least two organic layers and an inorganic layer are alternately stacked.

On the substrate 100, a multilayer film 110 including first to third pixel circuits PC1 to PC3 may be disposed. The first to third pixel circuits PC1 to PC3 of the multilayer film 110 may include wires, electrodes, and insulating layers disposed between the wires and the electrodes. The first to third pixel circuits PC1 to PC3 may each include at least one thin film transistor and at least one storage capacitor.

An upper surface of the multilayer film 110 is flat, and thus a first pixel electrode 210R, a second pixel electrode 210G, and a third pixel electrode 210B may be arranged on the multilayer film 110. The first, second, and third pixel electrodes 210R, 210G, and 210B may be formed on the substrate 100 by a deposition method, a sputtering method, or the like using a conductive material for the pixel electrode. When each of the first, second, and third pixel electrodes 210R, 210G, and 210B is an anode, the material for a pixel electrode may be selected from the group consisting of materials having a high work function to facilitate easy hole injection.

Each of the first, second, and third pixel electrodes 210R, 210G, and 210B may be a reflective electrode, a transflective electrode, or a transparent electrode. To form the first, second, and third pixel electrodes 210R, 210G, and 210B to be transmissive, materials for pixel electrodes may be selected from the group consisting of indium tin oxide (ITO), indium zinc oxide (IZO), tin oxide ($SnO_2$), zinc oxide (ZnO), and any combination thereof, but one or more embodiments are not limited thereto. Alternately, to form the first, second, and third pixel electrodes 210R, 210G, and 210B to be transflective or reflective, materials for pixel electrodes may be selected from the group consisting of magnesium (Mg), silver (Ag), aluminum (Al), aluminum-lithium (Al—Li), calcium (Ca), magnesium-indium (Mg—In), Mg—Ag, and any combination thereof, but one or more embodiments are not limited thereto.

Figure 5:
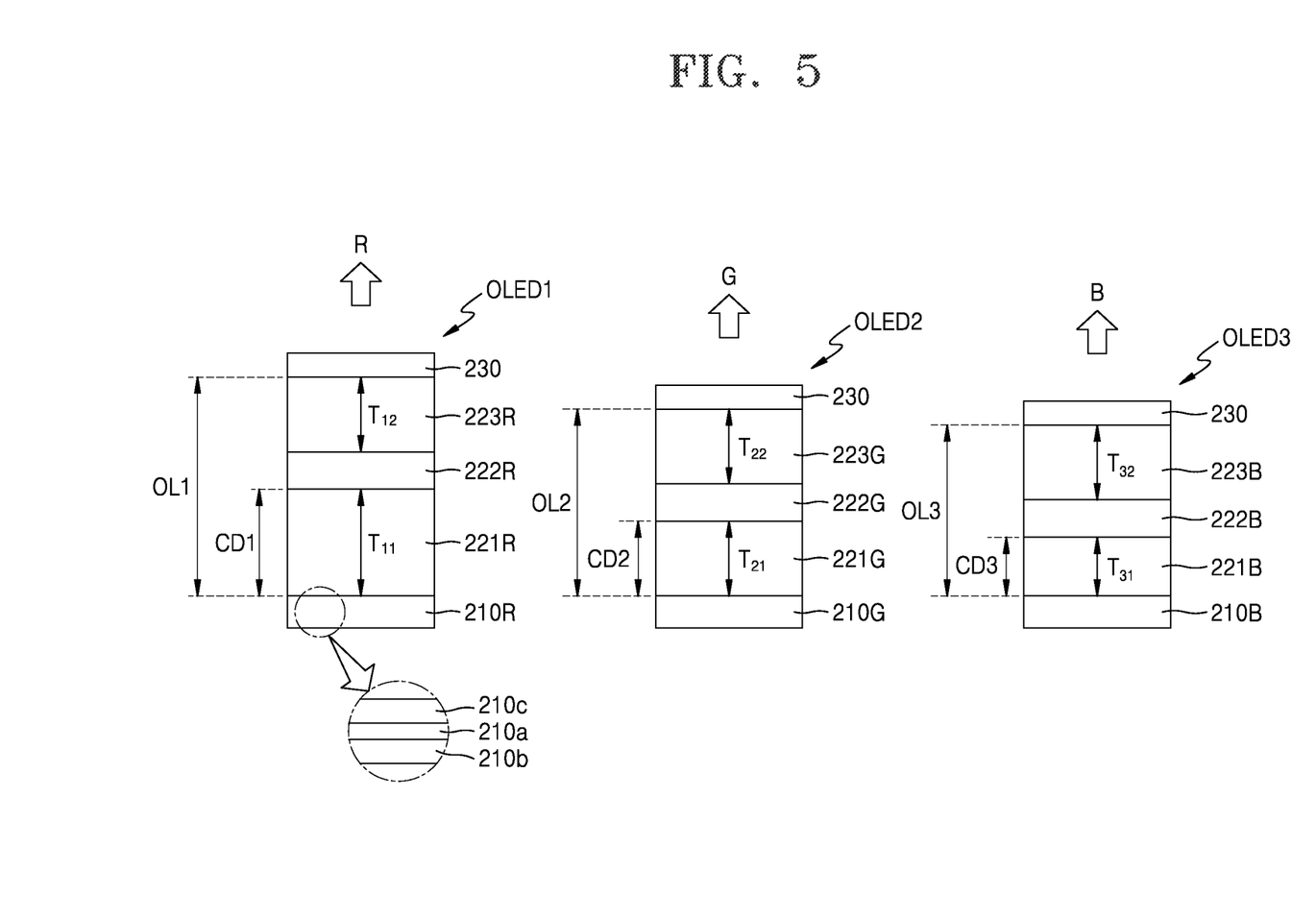
FIG. 5 is a diagram of a stack structure of a first organic light-emitting diode, a second organic light-emitting diode, and a third organic light-emitting diode, according to an embodiment.

The first, second, and third pixel electrodes 210R, 210G, and 210B may have a single-layer structure or a multilayer structure including layers. In an embodiment, the first, second, and third pixel electrodes 210R, 210G, and 210B are reflective electrodes and may have a multilayer structure including at least one reflective layer and at least one transparent conductive layer. For example, as illustrated in FIG. 5, the first pixel electrode 210R may have a tri-layered structure including transparent conductive layers 210b and 210c with a reflective layer 210a disposed between the transparent conductive layers 210b and 210c. FIG. 5 mainly illustrates the first pixel electrode 210R, but the second and third pixel electrodes 210G and 210B may have the same structures as the first pixel electrode 210R. For example, the first, second, and third pixel electrodes 210R, 210G, and 210B may have a tri-layered structure of ITO/Ag/ITO, but one or more embodiments are not limited thereto.

A pixel-defining layer 180 may be disposed on the first, second, and third pixel electrodes 210R, 210G, and 210B to expose at least some portions of the first, second, and third pixel electrodes 210R, 210G, and 210B. The pixel-defining layer 180 may define emission areas of respective pixels through openings exposing at least center portions of the first, second, and third pixel electrodes 210R, 210G, and 210B. The pixel-defining layer 180 prevents arcs, etc. from being generated at edges of the first, second, and third pixel electrodes 210R, 210G, and 210B by increasing distances between the opposite electrode 230 and the edges of the first, second, and third pixel electrodes 210R, 210G, and 210B. The pixel-defining layer 180 may include, for example, an organic material such as PI or hexamethyldisiloxane (HMDSO).

The opposite electrode 230 may face and may be disposed above the first, second, and third pixel electrodes 210R, 210G, and 210B to overlap the first, second, and third pixel electrodes 210R, 210G, and 210B. The opposite electrode 230 is integrally formed above the substrate 100, unlike the first pixel electrode 210R, the second pixel electrode 210G, and the third pixel electrode 210B that are spaced apart from each other and patterned. That is, the opposite electrode 230 may be formed in one single piece to cover all of the pixels arranged in the display area DA.

In an embodiment, the opposite electrode 230 may be a light-transmissive electrode. The light-transmissive electrode may be understood that the opposite electrode 230 is a transparent or a translucent electrode. Therefore, the organic light-emitting display apparatus according to the present embodiment may be a top-emission type display apparatus in which light emitted from first, second, and third organic emission layers 222R, 222G, and 222B passes through the opposite electrode 230 and is emitted to the outside.

The opposite electrode 230 may include, for example, at least one of Li, Ca, lithium fluoride (LiF/Ca), LiF/Al, Al, Ag, Mg, and gold (Au) and may be a layer or layers. The opposite electrode 230 may include thin metal having a thickness of several to several tens of nm and may have a refractive index of less than 1, and an extinction coefficient k may be great.

As the first pixel electrode 210R, the second pixel electrode 210G, and the third pixel electrode 210B are refractive electrodes, and the opposite electrode 230 is a light-transmissive electrode. The first to third organic light-emitting diodes OLED1 to OLED3 according to the present embodiment may have a microcavity structure.

A first intermediate layer 220R may be disposed between the first pixel electrode 210R and the opposite electrode 230, a second intermediate layer 220G may be disposed between the second pixel electrode 210G and the opposite electrode 230, and a third intermediate layer 220B may be disposed between the third pixel electrode 210B and the opposite electrode 230. Because the first to third pixels P1 to P3 emit light having different wavelengths, materials and thicknesses of the first, second, and third intermediate layers 220R, 220G, and 220B may differ from each other.

The first intermediate layer 220R may include the first organic emission layer 222R for emitting a first color and a first lower functional layer 221R disposed below the first organic emission layer 222R and a first upper functional layer 223R disposed oven the first organic emission layer 222R. The second intermediate layer 220G may include the second organic emission layer 222G for emitting a second color and a second lower functional layer 221G disposed below the second organic emission layer 222G and a second upper functional layer 223G disposed over the second organic emission layer 222G. The third intermediate layer 220B may include the third organic emission layer 222B for emitting a third color and a third lower functional layer 221B disposed below the third organic emission layer 222B and a third upper functional layer 223B disposed over the third organic emission layer 222B.

In an embodiment, the first organic emission layer 222R may emit light of a red wavelength, the second organic emission layer 222G may emit light of a green wavelength, and the third organic emission layer 222B may emit light of a blue wavelength. The first, second, and third organic emission layers 222R, 222G, and 222B may be respectively formed in the openings formed through the pixel defining layer 180 on the first lower functional layer 221R, the second lower functional layer 221G and the third lower functional layer 221B.

The first, second, and third organic emission layers 222R, 222G, and 222B may each include a host and a dopant. The dopant may include at least one of a phosphorescent dopant and a fluorescent dopant. The dopant content of an organic emission layer may generally be in a range between about 0.01 parts by weight and about 15 parts by weight with respect to about 100 parts by weight of a host, but one or more embodiments are not limited thereto.

A thickness of each of the first, second, and third organic emission layers 222R, 222G, and 222B may be between about 100 Å and about 1000 Å, for example, be between about 200 Å and about 600 Å. When the thicknesses of the first, second, and third organic emission layers 222R, 222G, and 222B satisfy the aforementioned range, the first, second, and third organic emission layers 222R, 222G, and 222B may have good emission characteristics without a substantial increase in a driving voltage.

The first lower functional layer 221R may be disposed between the first pixel electrode 210R and the first organic emission layer 222R, the second lower functional layer 221G may be disposed between the second pixel electrode 210G and the second organic emission layer 222G, and the third lower functional layer 221B may be disposed between the third pixel electrode 210B and the third organic emission layer 222B.

In an embodiment, the first, second, and third lower functional layers 221R, 221G, and 221B may each have a single-layer structure or a multilayer structure. The first, second, and third lower functional layers 221R, 221G, and 221B may be integrally formed above the substrate 100 as one single piece to cover all of the pixels. However, some layers (e.g., emission supper layers) included in the first, second, and third lower functional layers 221R, 221G, and 221B may be patterned to correspond to respective pixels.

The first upper functional layer 223R may be disposed between the first organic emission layer 222R and the opposite electrode 230, the second upper functional layer 223G may be disposed between the second organic emission layer 222G and the opposite electrode 230, and the third upper functional layer 223B may be disposed between the third organic emission layer 222B and the opposite electrode 230.

In an embodiment, the first, second, and third upper functional layers 223R, 223G, and 223B may each have a single-layer structure or a multilayer structure. The first, second, and third upper functional layers 223R, 223G, and 223B may be integrally formed as one single piece to cover all of the pixels.

Referring to FIG. 4, a capping layer 240 and a thin film encapsulation layer 300 may be further disposed on the opposite electrode 230.

The capping layer 240 may improve the resonance efficiency of a resonance structure formed between the first, second, and third pixel electrodes 210R, 210G, and 210B and the opposite electrode 230 by reflecting light that passes through the opposite electrode 230. Thus, the resonance efficiency of the resonance structure is improved, and the light extraction efficiency of the organic light-emitting display apparatus is improved.

The thin film encapsulation layer 300 may include at least one inorganic encapsulation layer and at least one organic encapsulation layer. In an embodiment, the thin film encapsulation layer 300 may include a first inorganic encapsulation layer 310, an organic encapsulation layer 320, and a second inorganic encapsulation layer 330 that are sequentially stacked.

Each of the first and second inorganic encapsulation layers 310 and 330 may include at least one inorganic insulating material. The inorganic insulating material may include aluminum oxide, tantalum oxide, hafnium oxide, zinc oxide, silicon oxide, silicon nitride, and/or silicon oxynitride. The organic encapsulation layer 320 may include a polymer-based material. The polymer-based material may include acryl-based resin, epoxy-based resin, PI, polyethylene, and the like. The acryl-based resin may include, for example, poly(methyl methacrylate) (PMMA), polyacrylic acid, and the like.

Figure 6:
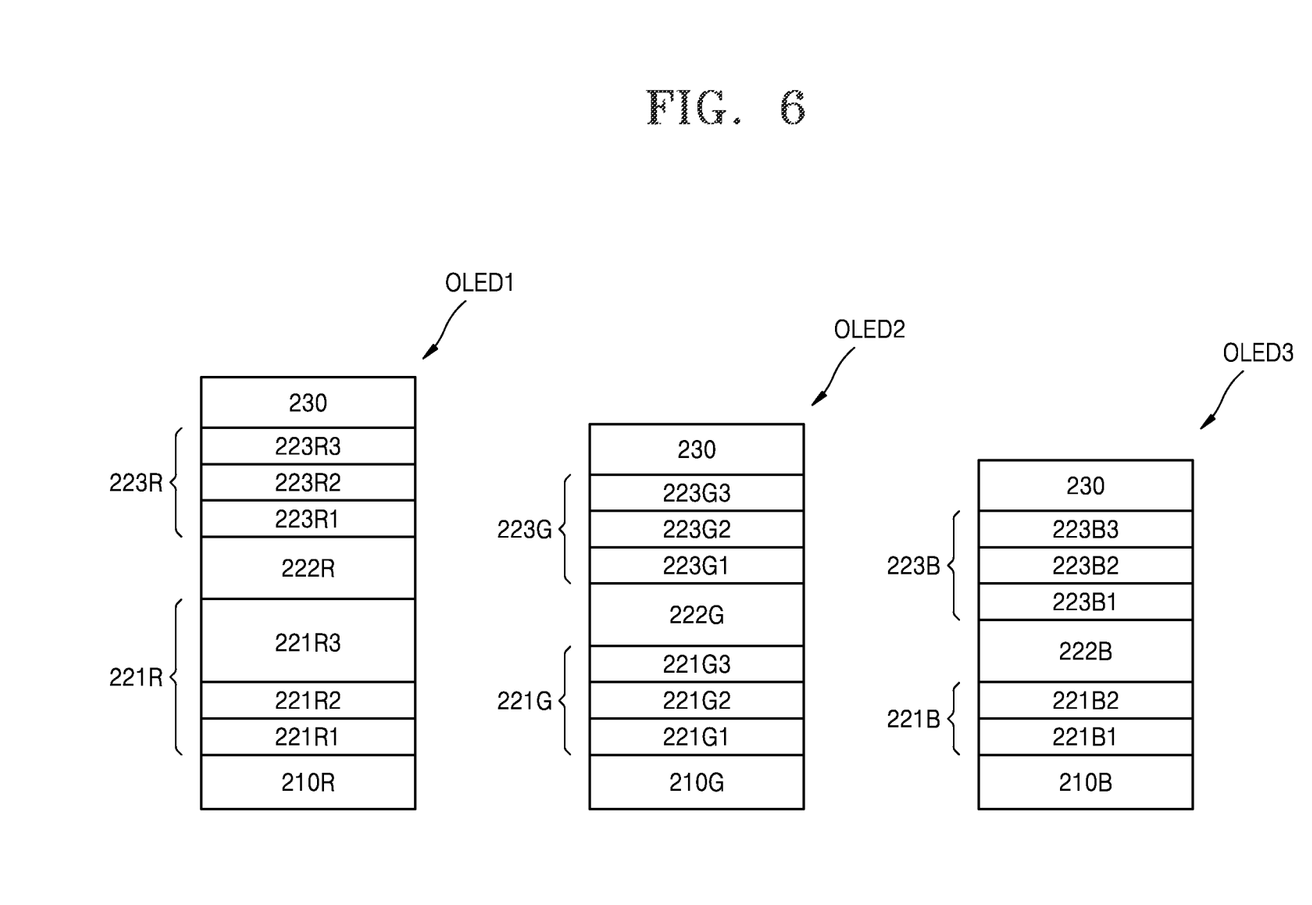
FIG. 6 is a diagram of a stack structure of the first organic light-emitting diode, the second organic light-emitting diode, and the third organic light-emitting diode, according to an embodiment.

FIGS. 5 and 6 are diagrams of a stack structure of the first organic light-emitting diode, the second organic light-emitting diode, and the third organic light-emitting diode, according to an embodiment.

Hereinafter, referring to FIG. 5, the first, second, and third lower functional layers 221R, 221G, and 221B and the first, second, and third upper functional layers 223R, 223G, and 223B will be described in detail.

Each of the first, second, and third lower functional layers 221R, 221G, and 221B may be defined as a hole transport region through which holes are transported.

The hole transport region may have i) a single-layer structure including a single layer including a single material, ii) a single-layer structure including a single layer including a plurality of different materials, or iii) a multilayer structure including layers including different materials.

In an embodiment, the hole transport region may include at least one layer selected from the group consisting of a hole injection layer (HIL), a hole transport layer (HTL), an emission support layer, and an electron blocking layer (EBL). In an embodiment, thicknesses of the HIL, the HTL, the emission support layer, and the EBL that are included in the first, second, and third lower functional layers 221R, 221G, and 221B may be different from each other.

For example, the hole transport region may have a single-layer structure including a single layer including a plurality of different materials or a multilayer structure including an HIL/an HTL, an HIL/an HTL/an emission support layer, an HIL/an emission support layer, an HTL/an emission support layer, or an HIL/an HTL/an EBL, which are sequentially stacked on the pixel electrode, but one or more embodiments are not limited thereto.

The hole transport region may include at least one selected from the group consisting of m-MTDATA, TDATA, 2-TNATA, NPB(NPD), 3-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/Poly(4-styrenesulfonate (PEDOT/PSS), polyaniline/camphor sulfonic acid (PANI/CSA), and polyaniline/poly(4-styrenesulfonate (PANI/PSS).

The emission support layer improves the light emission efficiency by adjusting an optical resonance distance according to wavelengths of light emitted from the emission layer, and the EBL prevents electron injection from an electron transport region. The emission support layer and the EBL may include the aforementioned materials. Thicknesses of the emission support layers in pixels may be different from each other. For example, a thickness of the emission support layer in the first organic light-emitting diode OLED1 which emits light having a long wavelength may be greater than a thickness of the emission support layer in the second organic light-emitting diode OLED2 which emits light having a relatively short wavelength.

The hole transport region may further include charge-generation materials to improve conductivity, in addition to the aforementioned materials. The charge-generation materials may be evenly or unevenly distributed in the hole transport region. For example, the charge-generation materials may be p-type dopants.

According to an embodiment, lowest unoccupied molecular orbital (LUMO) of the p-dopants may be less than or equal to −3.5 eV. The p-dopants may include at least one of a quinone derivative, metal oxide, and a cyano group-containing compound, but one or more embodiments are not limited thereto.

Each of the first, second, and third upper functional layers 223R, 223G, and 223B may be defined as an electron transport region.

The electron transport region may have i) a single-layer structure including a single material, ii) a single-layer structure including a single layer including a plurality of different materials, and iii) a multilayer structure including layers including different materials.

The electron transport region may include at least one of a buffer layer, a hole blocking layer, an electron adjusting layer, an electron transport layer (ETL), and an electron injection layer (EIL), but one or more embodiments are not limited thereto.

For example, the electron transport region may have a structure of the ETL/the EIL, the hole blocking layer/the ETL/the EIL, the electron adjusting layer/the ETL/the EIL, the buffer layer/the ETL/the EIL, or the like, which are sequentially stacked from the organic emission layer (that is, any one of the first, second, and third organic emission layers 222R, 222G, and 222B), but one or more embodiments are not limited thereto.

The electron transport region (e.g., the buffer layer, the hole blocking layer, the electron adjusting layer, or the ETL in the electron transport region) may include a metal-free compound including at least one electron-deficient nitrogen ring.

The electron transport region may include at least one compound selected from the group consisting of 2,9-Dimethyl-4,7-diphenyl-1,10-phenanthroline (BCP), 4,7-Diphenyl-1,10-phenanthroline (Bphen), Alq$_3$, BAlq, 3-(Biphenyl-4-yl)-5-(4-tert-butylphenyl)-4-phenyl-4H-1,2,4-triazole (TAZ), NTAZ, diphenyl(4-(triphenylsilyl)phenyl)-phosphine oxide (TSPO1), and 3P-T2T.

Thicknesses of the buffer layer, the hole blocking layer, the electron adjusting layer, the ETL, and the EIL in each of the first, second, and third upper functional layers 223R, 223G, and 223B may be different from each other.

In an embodiment, the thickness of the buffer layer, the hole blocking layer, or the electron adjusting layer may be, different from each other. In one embodiment, the thickness of the buffer layer, the hole blocking layer, or the electron adjusting layer may be between about 20 Å and about 1000 Å. In another embodiment, the thickness of the buffer layer, the hole blocking layer, or the electron adjusting layer may be between about 30 Å and about 300 Å. When the thickness of the buffer layer, the hole blocking layer, or the electron adjusting layer satisfies the above-described range, good hole blocking characteristics or electron adjusting characteristics may be obtained without any substantial increase in a driving voltage.

In one embodiment, the thickness of the ETL may be between about 100 Å and about 1000 Å. In another embodiment, the thickness of the ETL may be between about 150 Å and about 500 Å. When the thickness of the ETL satisfies the above range, good electron transport characteristics may be obtained without any substantial increase in a driving voltage.

The electron transport region (e.g., the ETL of the electron transport region) may further include a metal-containing material in addition to the aforementioned materials.

The metal-containing material may include at least one of an alkaline metal complex and an alkaline earth metal complex. Metal ions of the alkaline metal complex may be selected from the group consisting of Li ions, sodium (Na) ions, potassium (K) ions, rubidium (Rb) ions, and cesium (Cs) ions, and metal ions of the alkaline earth metal complex may be selected from the group consisting of beryllium (Be) ions, Mg ions, Ca ions, strontium (Sr) ions, and barium (Ba) ions. Ligands coordinating the metal ions with the alkaline metal complex and the alkaline earth metal complex may be selected, independently from each other, from the group consisting of hydroxyquinoline, hydroxyisoquinoline, hydroxybenzochinolin, hydroxyacridine, hydroxy penanteuridin, hydroxyphenyloxazol, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but one or more embodiments are not limited thereto.

For example, the metal-containing material may include a Li complex. The Li complex may include, for example, ET-D1 (lithium quinolate (LiQ)) or ET-D2.

ET-D1

ET-D2

The electron transport region may include the EIL facilitating injection of electrons from the opposite electrode 230. The EIL may directly contact the opposite electrode 230.

The EIL may have i) a single-layer structure including a single layer including a single material, ii) a single-layer structure including a single layer including a plurality of different materials, or iii) a multilayer structure including layers including different materials.

The EIL may include alkaline metal, alkaline earth metal, rare-earth metal, an alkaline metal compound, an alkaline earth metal compound, a rare-earth metal compound, an alkaline metal complex, an alkaline earth metal complex, a rare-earth metal complex, or any combination thereof.

The alkaline metal may be selected from the group consisting of Li, Na, K, Rb, and Cs. According to an embodiment, the alkaline metal may be Li, Na, or Cs. According to another embodiment, the alkaline metal may be Li or Cs, but one or more embodiments are not limited thereto.

The alkaline earth metal may be selected from the group consisting of Mg, Ca, Sr, and Ba.

The rare-earth metal may be selected from the group consisting of scandium (Sc), yttrium (Y), chromium (Cr), terbium (Tb), ytterbium (Yb), and gadolinium (Gd).

The alkaline metal compound, the alkaline earth metal compound, and the rare-earth metal compound may be selected from the group consisting of alkaline metal oxide, alkaline earth metal oxide, rare-earth metal oxide, and halide (e.g., fluoride, chloride, bromide, iodide, etc.).

The alkaline metal compound may be selected from the group consisting of the alkaline metal oxide such as $Li_2O$, $Cs_2O$, or $K_2O$ and the alkaline metal halide such as LiF, NaF, CsF, KF, LiI, NaI, CsI, or KI. According to an embodiment, the alkaline metal compound may be selected from the group consisting of LiF, $Li_2O$, NaF, LiI, NaI, CsI, and KI, but one or more embodiments are not limited thereto.

The alkaline earth metal compound may be selected from the group consisting of alkaline earth metal compounds such as BaO, SrO, CaO, $Ba_xSr_{1-x}O$ (0<x<1), and $Ba_xCa_{1-x}O$ (0<x<1). According to an embodiment, the alkaline earth metal compound may be selected from the group consisting of BaO, SrO, and CaO, but one or more embodiments are not limited thereto.

The rare-earth metal compound may be selected from the group consisting of $YbF_3$, $ScF_3$, $ScO_3$, $Y_2O_3$, $Ce_2O_3$, $GdF_3$, and $TbF_3$. According to an embodiment, the rare-earth metal compound may be selected from the group consisting of $YbF_3$, $ScF_3$, $TbF_3$, $YbI_3$, $ScI_3$, and $TbI_3$, but one or more embodiments are not limited thereto.

The alkaline metal complex, the alkaline earth metal complex, and the rare-earth metal complex may include ions of the above-described alkaline metal, alkaline earth metal, rare-earth metal, and ligands coordinating with metal ions of the alkaline metal complex, the alkaline earth metal complex, and the rare-earth metal complex may be selected, independently from each other, from the group consisting of hydroxyquinoline, hydroxyisoquinoline, hydroxybenzochinolin, hydroxyacridine, hydroxy penanteuridin, hydroxyphenyloxazol, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but one or more embodiments are not limited thereto.

As described above, the EIL may include alkaline metal, alkaline earth metal, rare-earth metal, an alkaline metal compound, an alkaline earth metal compound, a rare-earth metal compound, an alkaline metal complex, an alkaline earth metal complex, a rare-earth metal complex, or any combination thereof or may further include organic materials. When the EIL further includes organic materials, the alkaline metal, the alkaline earth metal, the rare-earth metal, the alkaline metal compound, the alkaline earth metal compound, the rare-earth metal compound, the alkaline metal complex, the alkaline earth metal complex, the rare-earth metal complex, or any combination thereof may be evenly or unevenly distributed in a matrix including the organic materials.

In one embodiment, a thickness of the EIL may be between about 1 Å and about 100 Å. In another embodiment, the thickness of the EIL may be between about 3 Å and about 90 Å. When the thickness of the EIL satisfies the above range, satisfactory electron injection characteristics may be obtained without any substantial increase in a driving voltage.

In an embodiment, as illustrated in FIG. 6, the first lower functional layer 221R of the first organic light-emitting diode OLED1 may include a first HIL 221R1/a first HTL 221R2/a first emission support layer 221R3 which are sequentially stacked on the first pixel electrode 210R, the second lower functional layer 221G of the second organic light-emitting diode OLED2 may include a second HIL 221G1/a second HTL 221G2/a second emission support layer 221G3 which are sequentially stacked on the second pixel electrode 210G, and the third lower functional layer 221B of the third organic light-emitting diode OLED3 may include a third HIL 221B 1/a third HTL 221B2 which are sequentially stacked on the third pixel electrode 210B.

The first emission support layer 221R3 and the second emission support layer 221G3 may be respectively included in the first organic light-emitting diode OLED1 emitting light of the red wavelength and the second organic light-emitting diode OLED2 emitting light of the green wavelength, respectively. The light extraction efficiency of the first organic light-emitting diode OLED1 and the second organic light-emitting diode OLED2 may be improved by controlling an optical resonance distance. Because the first organic light-emitting diode OLED1 emits red light having a relatively longer wavelength than green light emitted by the second organic light-emitting diode OLED1 and blue light emitted by the third organic light-emitting diode OLED3, and the second organic light-emitting diode OLED2 emits the green light having relatively longer wavelengths than the blue light emitted by the third organic light-emitting diode OLED3, the first emission support layer 221R3 which is disposed between the first hole transport layer 221R2 and the first organic emission layer 222R has a thickness greater than that of the second emission support layer 221G3 which is disposed between the second hole transport layer 221G2 and the second organic emission layer 222G to secure a proper optical resonance distance and the third organic light-emitting diode OLED3 may not have an emission support layer. In another embodiment, may also include an emission support layer, and in this case, a thickness of the emission support layer of the third organic light-emitting diode OLED3 may be less than those of the first and second emission support layers 221R3 and 221G3.

Also, as illustrated in FIG. 6, the first upper functional layer 223R of the first organic light-emitting diode OLED1 may include a first buffer layer 223R1/a first ETL 223R2/a first EIL 223R3, which are sequentially stacked on the first organic emission layer 222R, the second upper functional layer 223G of the second organic light-emitting diode OLED2 may include a second buffer layer 223G1/a second ETL 223G2/a second EIL 223G3, which are sequentially stacked on the second organic emission layer 222G, and the third upper functional layer 223G of the third organic light-emitting diode OLED3 may include a third buffer layer 223B1/a third ETL 223B2/a third EIL 223B3, which are sequentially stacked on the third organic emission layer 222B.

Referring back to FIG. 5, in the present embodiment, a thickness of the hole transport region may be between about 1000 Å and about 3000 Å. In one embodiment, when the hole transport region includes at least one of an HIL and an HTL, the thickness of the HIL may be between about 100 Å and about 9000 Å, and the thickness of the HTL may be between about 50 Å and about 2000 Å. In another embodiment, when the hole transport region includes at least one of an HIL and an HTL, the thickness of the HIL may be between about 100 Å and 1000 Å, and the thickness of the HTL may be between about 100 Å and about 1500 Å. When the thicknesses of the hole transport region, the HIL and the HTL, satisfy the above ranges, satisfactory hole transport characteristics may be obtained without any substantial increase in a driving voltage.

In more detail, the hole transport region, that is, thicknesses $t_{11}$, $t_{21}$, and $t_{31}$ of the first, second, and third lower functional layers 221R, 221G, and 221B, may differ according to wavelengths of light which are emitted from the first, second, and third organic emission layer 222R, 222G, and 222B. In an embodiment, the thickness ti, of the first lower functional layer 221R for emitting the red light may be between about 1800 Å and about 2600 Å, and the thickness $t_{12}$ of the first upper functional layer 223R to the thickness $t_{11}$ of the first lower functional layer 221R may have a ratio of about 1:1.2 to 1:1.4. Also, the thickness $t_{21}$ of the second lower functional layer 221G for emitting green light may be between about 1300 Å and about 1800 Å, and the thickness $t_{22}$ of the second upper functional layer 223G to the thickness $t_{21}$ of the second lower functional layer may have a ratio of about 1:1 to 1:1.02. Also, the thickness $t_{31}$ of the third lower functional layer 221B for emitting blue light may be between about 1000 Å and about 1600 Å, and the thickness $t_{32}$ of the third upper functional layer 223B to the thickness $t_{31}$ of the third lower functional layer 221B may have a ratio of about 1:07 to 1:0.9.

The thicknesses $t_{11}$, $t_{21}$, and $t_{31}$ of the first, second, and third lower functional layers 221R, 221G, and 221B may be defined as color distances CD. That is, the first color distance CD1 may be defined as a distance from an upper surface of the first pixel electrode to a lower surface of the first organic emission layer 222R. The second color distance CD2 may be defined as a distance from an upper surface of the second pixel electrode 210G to a lower surface of the second organic emission layer 222G. The third color distance CD3 may be defined as a distance from an upper surface of the third pixel electrode 210B to a lower surface of the third organic emission layer 222B. The first color distance CD1 may be substantially the same as a distance in which a second resonance of red light is produced. The second color distance CD2 may be substantially the same as a distance in which a second resonance of green light is produced. The third color distance CD3 may be substantially the same as a distance in which a second resonance of blue light is produced. Therefore, in one embodiment, the first color distance CD1 of the first organic light-emitting diode OLED1 may be between about 1800 Å and about 2600 Å. In another embodiment, the first color distance CD1 of the first organic light-emitting diode OLED1 may be between about 1900 Å and about 2100 Å. Also, in one embodiment, the second color distance CD2 of the second organic light-emitting diode OLED2 may be between about 1300 Å and about 1800 Å. In another embodiment, the second color distance CD2 of the second organic light-emitting diode OLED2 may be between about 1450 Å and about 1650 Å. In addition, in one embodiment, the third color distance CD3 of the third organic light-emitting diode OLED3 may be between about 1000 Å and about 1600 Å. In another embodiment, the third color distance CD3 of the third organic light-emitting diode OLED3 may be between about 1250 Å and about 1450 Å.

Moreover, in the present embodiment, a distance between each of the first, second, and third pixel electrodes 210R, 210G, and 210B and the opposite electrode 230 may be defined as optical lengths OL. That is, the optical lengths OL may be understood as a sum of the thicknesses of the lower functional layer, the organic emission layer, and the upper functional layer.

The first optical length OL1 may be substantially the same as a distance in which a third resonance of the red light is produced. The second optical length OL2 may be substantially the same as a distance in which a third resonance of the green light is produced. The third optical length OL3 may be substantially the same as a distance in which a third resonance of the blue light is produced. In one embodiment, the first optical length OL1 of the first organic light-emitting diode OLED1 may be between about 3500 Å and about 4800 Å. In another embodiment, the first optical length OL1 of the first organic light-emitting diodes OLED1 may be between about 3600 Å and about 4800 Å. In one embodiment, the second optical length OL2 of the second organic light-emitting diodes OLED2 may be between about 3000 Å and about 4000 Å. In another embodiment, the second optical length OL2 of the second organic light-emitting diodes OLED2 may be between about 3150 Å and about 3850 Å. In one embodiment, the third optical length OL3 of the third organic light-emitting diodes OLED3 may be between about 2500 Å and about 3600 Å. In another embodiment, the third optical length OL3 of the third organic light-emitting diodes OLED3 may be between about 2750 Å and about 3450 Å.

The color distances CD and the optical lengths OL may be used to define resonances. As a comparative example, when the secondary resonances occurs in an organic light-emitting diode, the color distances CD and the optical lengths OL are designed to produce the secondary resonances (that is, a 2CD/2OL resonance) of the light of a corresponding wavelength. Also, when the third resonances occurs in the organic light-emitting diode, the color distances CD and the optical lengths OL are designed to produce the third resonance (that is, 3CD/3OL resonance) of the light of a corresponding wavelength.

On the other hand, in the present embodiment, in the organic light-emitting diode (e.g., the first, second, or third organic light-emitting diodes OLED1, OLED2, or OLED3) emitting the light of a predetermined wavelength, the color distances CD may be substantially the same as the distance in which the second resonance of the light of the predetermined wavelength is produced, and at the same time, the second optical length OL may be substantially the same as the distance in which the third resonance of the light of the predetermined wavelength is produced. That is, it may be understood that the "second CD/third OL resonance" of the organic light-emitting diode according to the present embodiment is produced.

The "second CD/third OL resonance" is different from the second resonance (the 2CD/2OL resonance) and the third resonance (the 3CD/3OL resonance) described above in the comparative examples. To enable the 'organic light-emitting diode' to satisfy the second resonance, the thickness of the 'lower functional layer' corresponding to the color distances CD and a sum of the thicknesses of the 'lower functional layer', the 'organic emission layer', and the 'upper functional layer', which corresponds to the optical lengths OL, have to satisfy the distance corresponding to the second resonance. For example, in the case of the second resonance, the thickness of the 'upper functional layer' has to be between about 200 Å and about 450 Å to satisfy the optical lengths OL.

Also, to enable the 'organic light-emitting diode' to satisfy the third resonance, the thickness of the 'lower functional layer' corresponding to the color distances CD and a sum of the thicknesses of the 'lower functional layer', the 'organic emission layer', and the 'upper functional layer', which corresponds to the optical lengths OL, have to satisfy the distance corresponding to the third resonance. For example, in the case of the third resonance, the thickness of the 'lower functional layer' has to be between about 2800 Å and about 3000 Å to satisfy the optical lengths OL.

As described above, in the case of the 'organic light-emitting diode' to satisfy the second resonance, the thickness of the 'lower functional layer' is between about 1100 Å and about 2300 Å, but the thickness of the 'upper functional layer' is between about 200 Å and about 450 Å. Therefore, a charge imbalance in the 'organic emission layer' is caused due to the difference in thicknesses of the 'lower functional layer' and the 'upper functional layer', resulting in the degradation of lifetime characteristics of the organic emission layers.

Also, in the case of the third resonance, when the 'organic light-emitting diode' to satisfy the third resonance, the thickness of the 'lower functional layer' is between about 1100 Å and about 2300 Å, but the thickness of the 'upper functional layer' is between about 2800 Å and about 3000 Å. Therefore, a charge imbalance in the 'organic emission layer' is caused due to the difference in thicknesses of the 'lower functional layer' and the 'upper functional layer', resulting in the degradation of lifetime characteristics of the organic emission layers.

In the first, second, and third organic light-emitting diodes OLED1, OLED2, and OLED3 according to the present embodiment, the color distances CD may be substantially the same as the distance in which the second resonance of the light of a predetermined wavelength is produced, and at the same time, the optical lengths OL may be substantially the same as the distance in which the third resonance of the light of the predetermined wavelength is produced. Therefore, in the case of the first to third organic light-emitting diodes OLED1 to OLED3 according to the present embodiment which satisfy the "second CD/third OL resonance," the thicknesses $t_{11}$, $t_{21}$, and $t_{31}$ of the 'first, second, and third lower functional layers' 221R, 221G, and 221B are between about 1000 Å and about 1600 Å in the blue wavelength, between about 1300 Å and about 1800 Å in the green wavelength, and between about 1800 Å and about 2600 Å in the red wavelength, respectively, and the thicknesses $t_{12}$, $t_{22}$, and $t_{32}$ of the 'first, second, and third upper functional layers' 223R, 223G, and 223B may each be between about 1300 Å and about 1800 Å. Although there are some differences in wavelengths for the first to third organic light-emitting diodes OLED1 to OLED3 according to the present embodiment which satisfy the "second CD/third OL resonance," the thicknesses of the 'first, second, and third lower functional layers' 221R, 221G, and 221B and the 'first, second, and third upper functional layers' 223R, 223G, and 223B may have similar value, respectively. Therefore, a thickness imbalance between the 'first, second, and third lower functional layers' 221R, 221G, and 221B and the 'first, second, and third upper functional layers' 223R, 223G, and 223B is minimized, and the lifetime characteristics of the first, second and third organic emission layers 222R, 222G and 222B may be effectively improved.

Figure 7:
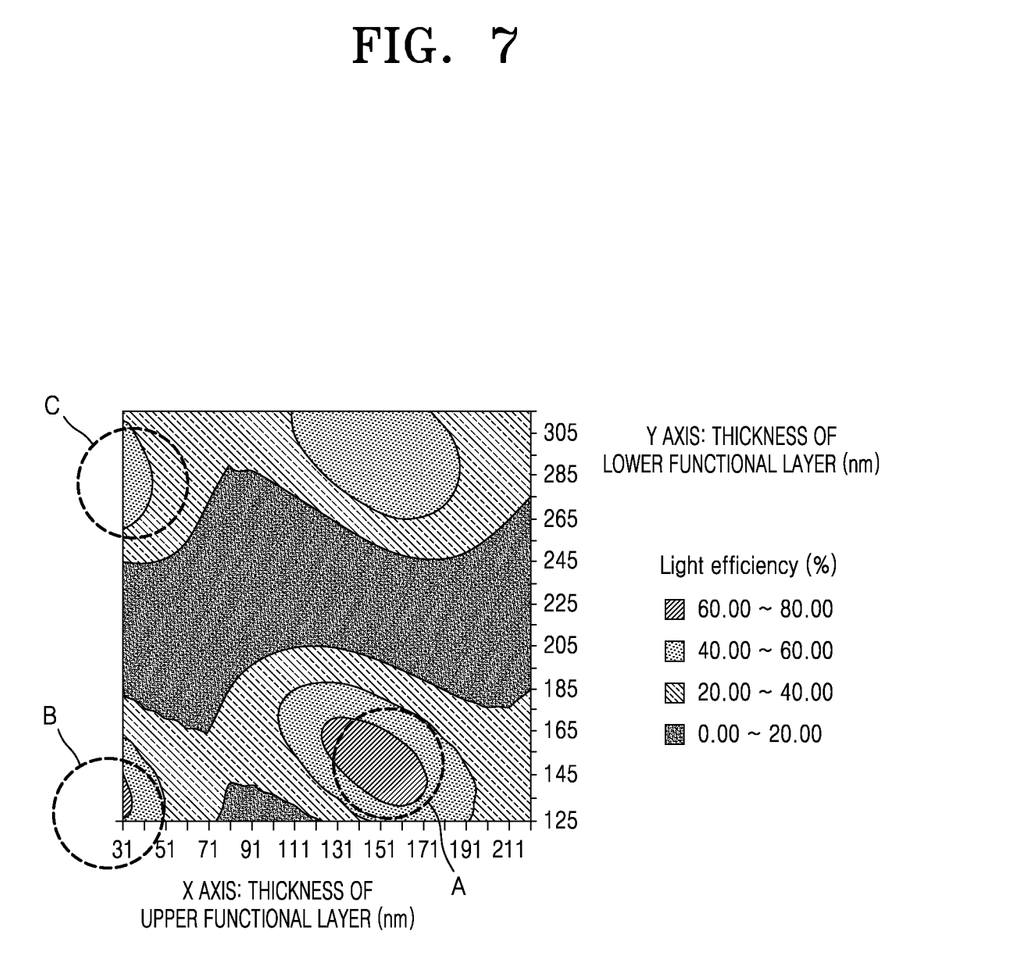
FIG. 7 is a graph schematically showing a HAMOS simulation result of an organic light-emitting diode, according to an embodiment.
Figure 8:
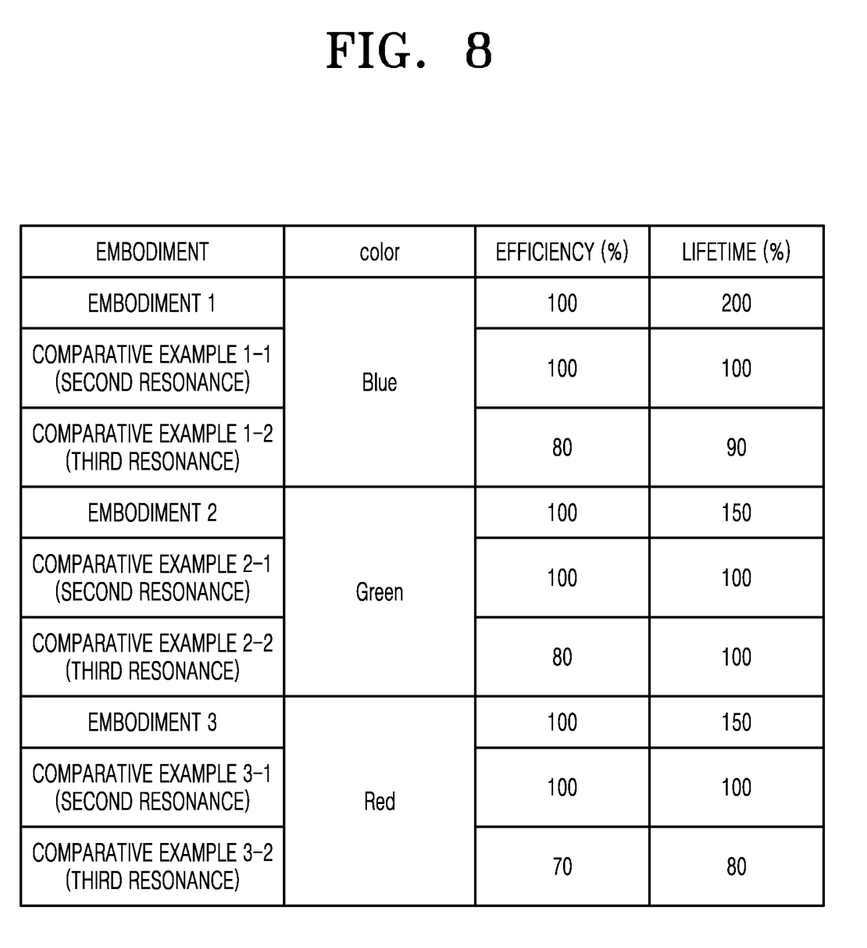
FIG. 8 is a table in which the light efficiency and a lifetime of the organic light-emitting diode according to an embodiment are compared.

FIG. 7 is a graph showing a Hydrodynamic Analysis and Motion Simulation (HAMOS simulation) result of an organic light-emitting diode, according to an embodiment, and FIG. 8 is a table in which the light efficiency and a lifetime of the organic light-emitting diode according to an embodiment are compared.

FIG. 7 is a graph showing the HAMOS simulation result of the second organic light-emitting diode OLED2 which emits green light, according to an embodiment. In the graph of FIG. 7, an X axis indicates a thickness of an upper functional layer (223G), and a Y axis indicates a thickness of a lower functional layer (221G).

In the graph of FIG. 7, a portion A indicates the "second CD/third OL resonance" according to the present embodiment, a portion B indicates the second resonance (the 2CD/2OL resonance) (hereinafter, a comparative example 1), and a portion C indicates the third resonance (the 3CD/3OL resonance) (hereinafter, a comparative example 2). The efficiency is uniform (60-80) in the embodiment (A) than the comparative example 1 (B), but the efficiency degrades (40-60) in the comparative example 2 (C).

When the embodiment (A) is compared to the comparative example 1 (B), the thickness of the upper functional layer of the embodiment (A) is greater than that of the upper functional layer of the comparative example 1 (B). That is, in the embodiment A and the comparative example 1 (B), the thicknesses of the lower functional layers are substantially identical in the range between about 125 nm and about 180 nm, but the thickness of the upper functional layer of the embodiment (A) is between about 130 nm and about 180 nm, and the thickness of the upper functional layer of the comparative example 1 (B) is between about 31 nm and about 40 nm. Because the thickness of the upper functional layer having the "second CD/third OL resonance" structure is greater than that having the second resonance structure, there may be an issue regarding in the comparative example 1 (B). However, according to the HAMOS simulation result, the organic light-emitting diode which has the "second CD/third OL resonance" structure does not have the degradation of the light efficiency.

Referring to the table of FIG. 8, the light efficiency and lifetimes according to embodiments and comparative examples are compared. In the table of FIG. 8, the embodiments 1 to 3 are embodiments of the "second CD/third OL resonance" with respect to predetermined wavelengths.

According to the comparative examples (the comparative examples 1-2, 2-2, and 3-2) having a third resonance in each wavelength, the light efficiency and the lifetime degrade as compared to those measured in the comparative examples the comparative examples 1-1, 2-1, and 3-1) having the second resonance. Assuming that the second resonance is optimal, it is found that the organic light-emitting diode according to embodiments of the present inventive concept (Embodiments 1 to 3) maintains the same light efficiency in the red, green, and blue wavelengths as the organic light-emitting diode according to the comparative examples (Comparative Examples 1-1, 2-1, and 3-1) having the second resonance and that the lifetime of the organic light-emitting diode increases by 150 to 200% as compared to the comparative examples (Comparative Examples 1-1, 2-1, and 3-1) having the second resonance. It is identified through the tests of FIGS. 7 and 8 that the light efficiency of the organic light-emitting diode according to an embodiment of the present inventive concept is great and the lifetime thereof is effectively improved.

According to the one or more embodiments of the disclosure, an organic light-emitting diode, of which a lifetime effectively expands, and an organic light-emitting display apparatus including the same may be implemented. However, the scope of the disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus, comprising:
   a first pixel electrode, a second pixel electrode, and a third pixel electrode;
   an opposite electrode disposed on the first pixel electrode, the second pixel electrode, and the third pixel electrode, and the opposite electrode facing the first pixel electrode, the second pixel electrode, and the third pixel electrode;
   a first organic emission layer disposed for emitting a first color, the first organic emission layer between the first pixel electrode and the opposite electrode;
   a second organic emission layer for emitting a second color, the second organic emission layer disposed between the second pixel electrode and the opposite electrode;
   a third organic emission layer for emitting a third color, the third organic emission layer disposed between the third pixel electrode and the opposite electrode;
   a first lower functional layer disposed between the first pixel electrode and the first organic emission layer;
   a second lower functional layer disposed between the second pixel electrode and the second organic emission layer;
   a third lower functional layer disposed between the third pixel electrode and the third organic emission layer;
   a first upper functional layer disposed between the first organic emission layer and the opposite electrode;
   a second upper functional layer disposed between the second organic emission layer and the opposite electrode;
   a third upper functional layer disposed between the third organic emission layer and the opposite electrode,
   wherein the second organic emission layer emits green light,
   a thickness of the second upper functional layer is equal to or greater than 1300 Å and less than or equal to 1800 Å,
   a thickness of the second lower functional layer is equal to or greater than 1300 Å and less than or equal to 1800 Å, and
   the thickness of the second lower functional layer is different than a corresponding thickness of the first lower functional layer.

2. The organic light-emitting display apparatus of claim 1,
   a distance between an upper surface of the second pixel electrode and a lower surface of the opposite electrode is a first prescribed distance in which a third resonance of the green light is produced, and
   a distance between the upper surface of the second pixel electrode and a lower surface of the second organic emission layer is a second prescribed distance in which a second resonance of the green light is produced.

3. The organic light-emitting display apparatus of claim 1, wherein a ratio of a thickness of the first upper functional layer to a thickness of the first lower functional layer is different from a ratio of the thickness of the second upper functional layer to the thickness of the second lower functional layer.

4. The organic light-emitting display apparatus of claim 1, wherein the thickness of the second upper functional layer to the thickness of the second lower functional layer has a ratio of 1:1 to 1:1.02.

5. The organic light-emitting display apparatus of claim 1, wherein:
   the first organic emission layer emits red light, and
   a thickness of the first upper functional layer equal to or greater than 1300 Å and less than or equal to 1800 Å.

6. The organic light-emitting display apparatus of claim 5, wherein:
   a thickness of the first lower functional layer is equal to or greater than 1800 Å and less than or equal to 2600 Å.

7. The organic light-emitting display apparatus of claim 5, wherein the thickness of the first upper functional layer to a thickness of the first lower functional layer has a ratio of 1:1.2 to 1:1.4.

8. The organic light-emitting display apparatus of claim 1, wherein:
   the third organic emission layer emits blue light, and
   a thickness of the third upper functional layer equal to or greater than 1300 Å and less than or equal to 1800 Å.

9. The organic light-emitting display apparatus of claim 8, wherein
   a thickness of the third lower functional layer is equal to or greater than about 1000 Å and less than or equal to about 1600 Å.

10. The organic light-emitting display apparatus of claim 8, wherein the thickness of the third upper functional layer to a thickness of the third lower functional layer has a ratio of 1:0.7 to 1:0.9.

11. The organic light-emitting display apparatus of claim 1, wherein each of the first pixel electrode, the second pixel electrode, and the third pixel electrode includes a reflective electrode, and the opposite electrode includes a light-transmissive electrode.

12. The organic light-emitting display apparatus of claim 1, further comprising:
- a capping layer disposed on the first pixel electrode, the second pixel electrode, and the third pixel electrode.

13. The organic light-emitting display apparatus of claim 1, wherein the thickness of the second lower functional layer is different than a corresponding thickness of the third lower functional layer.

14. The organic light-emitting display apparatus of claim 13, wherein the thickness of the first lower functional layer is different than the corresponding thickness of the third lower functional layer.

15. The organic light-emitting display apparatus of claim 1, wherein
- the thickness of the second lower functional layer equal to or greater than 1300 Å and less than or equal to 1800 Å defines an available thickness range of the second lower functional layer;
- the available thickness range of the second lower functional layer is different than a corresponding available thickness range of the first lower functional layer.

16. The organic light-emitting display apparatus of claim 15, wherein the available thickness range of the second lower functional layer is different than a corresponding available thickness range of the third lower functional layer.

\* \* \* \* \*